United States Patent [19]

Stevens

[11] Patent Number: 5,040,071
[45] Date of Patent: Aug. 13, 1991

[54] IMAGE SENSOR HAVING MULTIPLE HORIZONTAL SHIFT REGISTERS

[75] Inventor: Eric G. Stevens, Rochester, N.Y.

[73] Assignee: Eastman Kodak Company, Rochester, N.Y.

[21] Appl. No.: 496,839

[22] Filed: Mar. 21, 1990

[51] Int. Cl.$^5$ .................. H04N 3/14; H04N 5/335
[52] U.S. Cl. .................. 358/213.26; 358/213.23; 358/213.31; 357/24; 377/57
[58] Field of Search .................. 358/213.31, 213.11, 358/213.23, 213.26, 213.29, 213.22; 357/30 D, 24 LR; 377/57, 60–63, 77

[56] References Cited

U.S. PATENT DOCUMENTS

| | | | |
|---|---|---|---|
| 4,559,550 | 12/1985 | Koike et al. | 357/24 |
| 4,694,316 | 9/1987 | Chabbal | 357/24 LR |
| 4,750,042 | 6/1988 | Murayama et al. | 358/213.31 |
| 4,774,586 | 9/1988 | Koike et al. | 358/213.29 |
| 4,807,037 | 2/1989 | Iesaka et al. | 358/213.31 |
| 4,837,630 | 6/1989 | Ueda | 358/213.26 |
| 4,908,518 | 3/1990 | Losee et al. | 358/213.23 |
| 4,949,183 | 8/1990 | Stevens | 358/213.23 |
| 4,987,466 | 1/1991 | Shibata et al. | 357/24 |

FOREIGN PATENT DOCUMENTS 0085980 7/1981 Japan ................. 358/213.31

Primary Examiner—Howard W. Britton
Assistant Examiner—Safet Metjahic
Attorney, Agent, or Firm—Donald D. Schaper

[57] ABSTRACT

An image sensor is disclosed which comprises an imaging region and horizontal shift registers which receive charge carriers generated in the imaging region and transfer them to an output circuit for processing. In order to facilitate the transfer of charge carriers out of the sensor and to provide an image sensor which has a simplified structure, dual horizontal transfer registers are used and transfer of charge carriers between the two registers is accomplished without a separate transfer gate electrode. Transfer regions are disposed between alternate storage regions of the registers such that charge carriers in one-half of the storage regions in one register can be transferred to storage regions in the other register. The two registers can then be clocked out in parallel to read out a single line.

16 Claims, 3 Drawing Sheets

IMAGE SENSOR HAVING MULTIPLE HORIZONTAL SHIFT REGISTERS

CROSS REFERENCE TO RELATED APPLICATION

Reference is made to U.S. patent application, Ser. No. 442,749, entitled Image Sensor, filed in the name of Stevens on Nov. 29, 1989; this application is assigned to the assignee of the present invention.

BACKGROUND OF THE INVENTION

1. Field of the Invention

The present invention relates to an image sensor, and more particularly, to an image sensor having dual horizontal transfer registers.

2. State of the Prior Art

Solid-state image sensors of the interline type normally include an array comprised of columns and rows of photodetectors. A so-called vertical shift register is located adjacent each of the columns of photodetectors, and charge carriers generated in the photodetectors are transferred to the vertical shift registers during each frame time. The detected image is then shifted down in unison and transferred to a horizontal shift register one line at a time. The horizontal shift register delivers the charge carriers in each line to signal processing circuitry before the next line is shifted in.

One of the problems in arrays of the type described above is to provide for a fast and efficient transfer of charge carriers from the photodetectors to the signal processing circuitry. One partial solution to this problem is to provide dual horizontal transfer registers, as shown, for example, in U.S. Pat. No. 4,750,042. The image sensor in this patent comprises a plurality of light-receiving elements arranged in a matrix, vertical CCD's for transferring charge carriers generated in the light-receiving elements out of the matrix, and two horizontal transfer registers connected to the image receiving portion through a transfer gate. The two horizontal transfer registers are connected in parallel with each other through a gate electrode so that charge carriers can be transferred from one register to the other. When both registers are full, the charge carriers are transferred to output circuitry by means of common clocking signals. A disadvantage of the image sensor shown in this patent is that separate gate electrodes are required between the two horizontal transfer registers. This makes the device more difficult to manufacture, and makes control of the device more difficult, since separate clocking signals must be provided to each of the gate electrodes.

SUMMARY OF THE INVENTION

It is an object of the present invention to overcome the problems in the prior art discussed above and to provide an improved image sensor.

In accordance with the present invention, there is provided an image sensor comprising: an imaging region which includes a substrate of semiconductor material, the region including means in the material for accumulating charge carriers and for transferring the charge carriers from the region; at least two shift registers arranged in a side-by-side relationship adjacent the region, one of the shift registers including a series of storage regions for receiving charge carriers from the region; means for controlling the transfer of charge carriers from the one shift register to another shift register, the controlling means including transfer regions adjacent less than all of the storage regions, each of the transfer regions including a barrier implant therein; means for effecting the transfer of charge carriers from the one shift register to the other shift register; and means for clocking the shift registers to transfer the charge carriers from the registers to an output circuit.

In one embodiment of the present invention, the image sensor comprises an imaging region which includes a matrix of photosensitive elements for accumulating charge carriers and columns of CCD's for transferring charge carriers out of the imaging region. The charge carriers are transferred to two two-phase horizontal shift registers which are adapted to transfer the charge carriers to an output circuit. The two shift registers are connected by means of transfer regions located between the registers at every other storage region of the registers. Charge carriers in a row of charge carriers can be shifted through the transfer regions from a first register to the second register by means of a gate structure which is formed as a contiguous part of the gate electrode of the second register.

In the transfer of charge carriers from the imaging region, a row of charge carriers are shifted into the first horizontal register. Charge carriers in one-half of the storage regions in the first register are then shifted through the transfer regions to the second horizontal register. The charge carriers in the first register are then shifted to align with the charge carriers in the second register, and the charge carriers in both registers are then read out in parallel.

One of the main advantages of the present invention over known area sensors is that the gate electrodes are eliminated between the imaging region and the horizontal shift registers and between the two horizontal shift registers. The transfer of charge carriers between registers is accomplished by means of a transfer gate which includes a relatively wide transfer region and a barrier implant in the transfer region. The wide transfer region functions to eliminate potential barriers caused by narrow-channel effects. The present invention can be employed with both area sensors and linear sensors; it can also be used with various architectures, including interline and full-frame architectures.

The transfer regions between the two horizontal shift registers are placed adjacent every other storage region in the registers, and thus, the image sensor of the present invention is particularly suitable for use in clocking out a single line of data from two shift registers. Further, the transfer from the vertical shift registers to the horizontal shift registers is made with a minimum number of clock pulses, thereby reducing the amount of time required for the transfer to be completed. This reduction is important, since the transfer usually occurs during the horizontal retrace time which is quite short, especially for HDTV systems.

Other features and advantages will become apparent upon reference to the following description of the preferred embodiment when read in light of the attached drawings.

DESCRIPTION OF THE PREFERRED EMBODIMENTS

Figure 1:
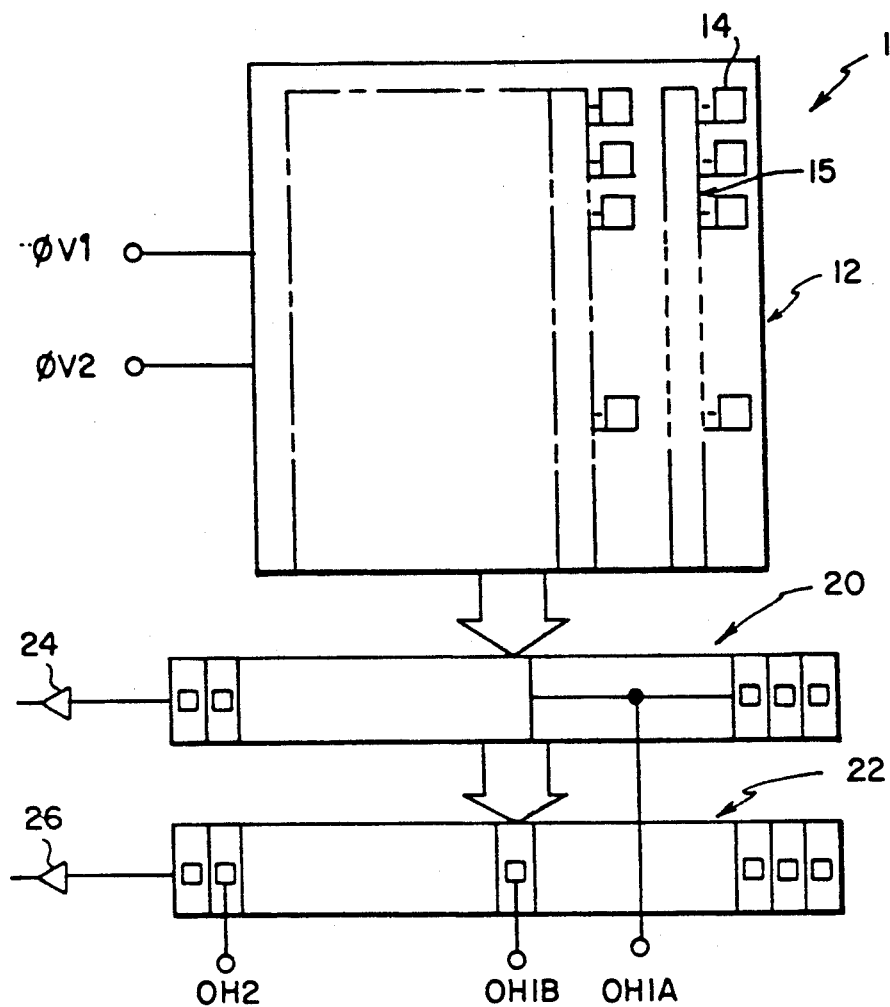
FIG. 1 is a plan view of the image sensor of the present invention.

With reference to FIG. 1, there is shown an image sensor 10 which is constructed in accordance with the present invention. Image sensor 10 comprises an imaging region 12 which includes photosensitive elements 14 arranged in columns and rows. Adjacent each column of elements 14 is a vertical shift register 15 for receiving charge carriers from the elements 14 and transferring the charge carriers out of the imaging region 12. The charge carriers are transferred from region 12 to two horizontal shift registers 20 and 22. Shift registers 15, 20, and 22 are charge-coupled devices (CCD's). As will be explained in more detail hereinafter, charge carriers from imaging region 12 are transferred into register 20, one row at a time. From register 20, half of the charge carriers can be shifted into register 22. When both registers 20 and 22 contain the charge carriers in one row, the charge carriers can be shifted out to an output circuit (not shown) through buffer amplifiers 24 and 26.

Figure 3:
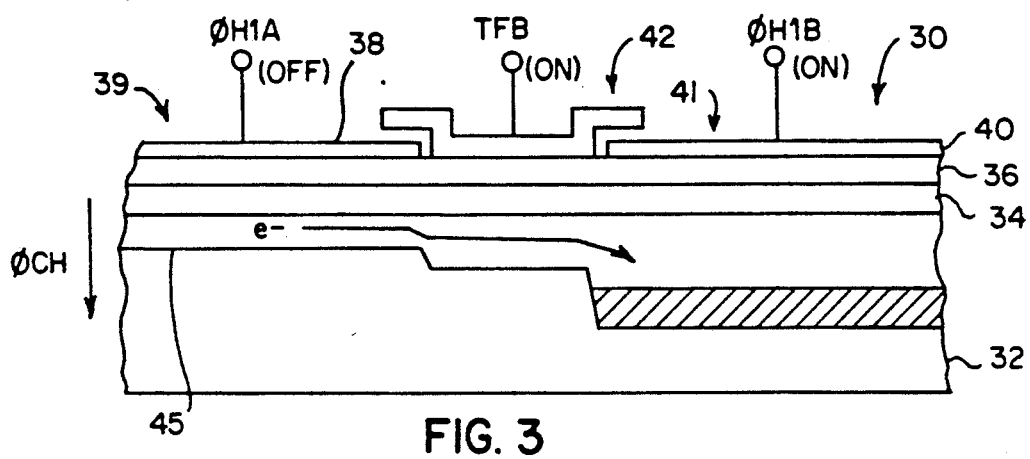
FIG. 3 is a cross section of a prior-art device.

In FIG. 3, a prior-art arrangement is shown for transferring charge carriers between shift registers. A device 30 in FIG. 3 comprises a p-type substrate 32 which has an n-type buried channel 34 formed therein. A silicon dioxide insulating layer 36 is formed on substrate 32. An electrode 38 of a CCD in a first register 39 is shown at one side of device 30, and an electrode 40 of a CCD in a second register 41 is shown at an opposite side of device 30. Between electrodes 38 and 40 is a gate electrode 42. In the transfer of charge carriers from a CCD in the first register 39 to a CCD in the second register 41, electrode 38 is off, and electrodes 40 and 42 are turned on. A potential profile 45, produced in device 30 during the transfer of charge carriers e−, is shown in FIG. 3. The channel potential, $\phi CH$, increases in the direction of the arrow. A disadvantage of this type of device is, as noted above, the necessity to provide the separate gate electrode 42 and a clocking signal to the electrode 42 in order to achieve a transfer of charge carriers from one register to the other.

Figure 2:
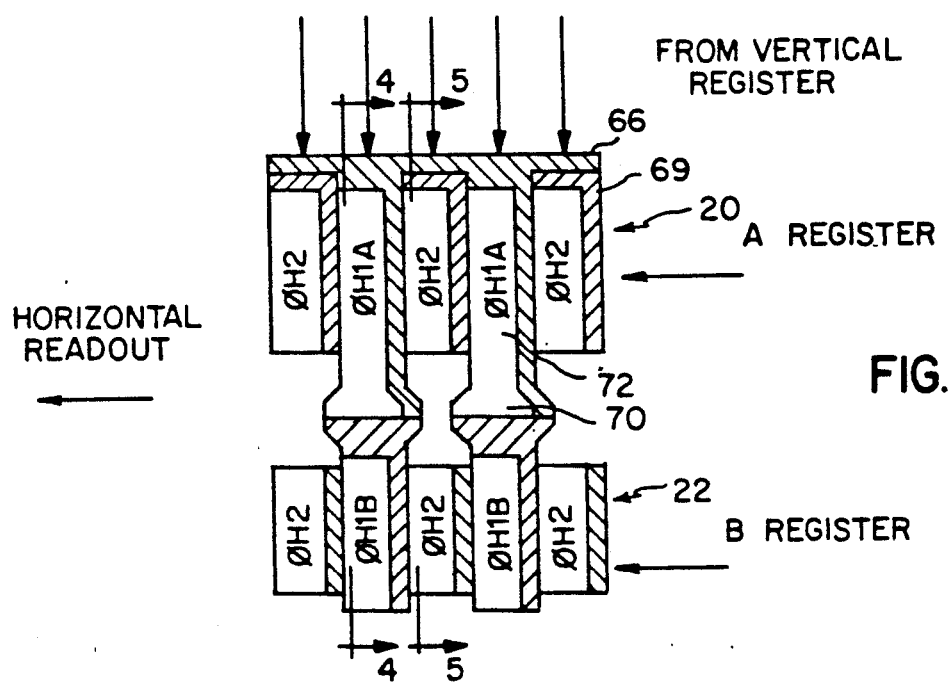
FIG. 2 is an enlarged plan view of a portion of the horizontal shift registers.
Figure 4:
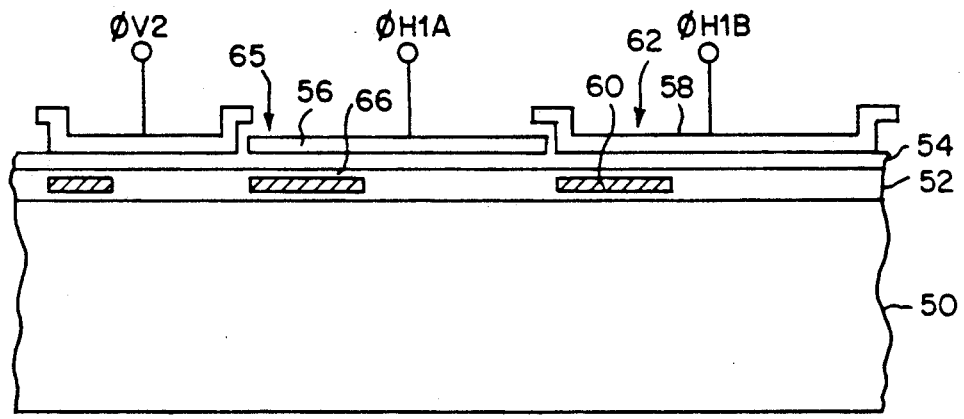
FIG. 4 is a cross section taken along the line 4—4 in FIG. 2.
Figure 8:
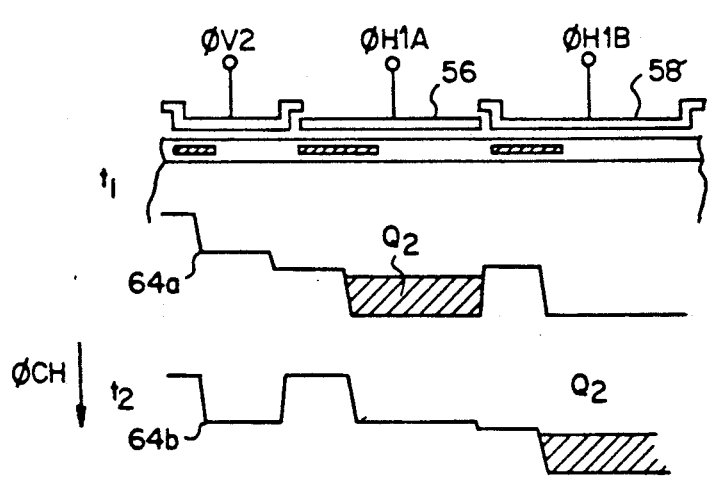

In FIG. 4, there is shown a cross section through registers 20 and 22, taken along the line 4—4 in FIG. 2. As shown in FIG. 4, a substrate 50 includes a buried channel 52. Substrate 50 can be, for example, a p-type material, and buried channel 52 can be an n-type material. An insulating layer 54 is formed on substrate 50. An electrode 56 in register 20 and an electrode 58 in register 22 are formed over the insulating layer 54. Electrodes 56 and 58 can be formed, for example, from polysilicon. A p-type barrier implant 60 is formed in buried channel 52 to form a transfer gate 62 which functions with electrode 58. Such an arrangement eliminates the need for a separate transfer-gate electrode as shown in the prior-art device in FIG. 3. The arrangement shown in FIG. 4 is a true two-phase CCD process, that is, only a single level of polysilicon is required for each phase. A potential profile 64b is shown in FIG. 8 for transferring charge carriers from register 20 to register 22. The potential profile 64b is produced when the voltage to electrode 56 is turned off and the voltage to electrode 58 is turned on.

Figure 5:
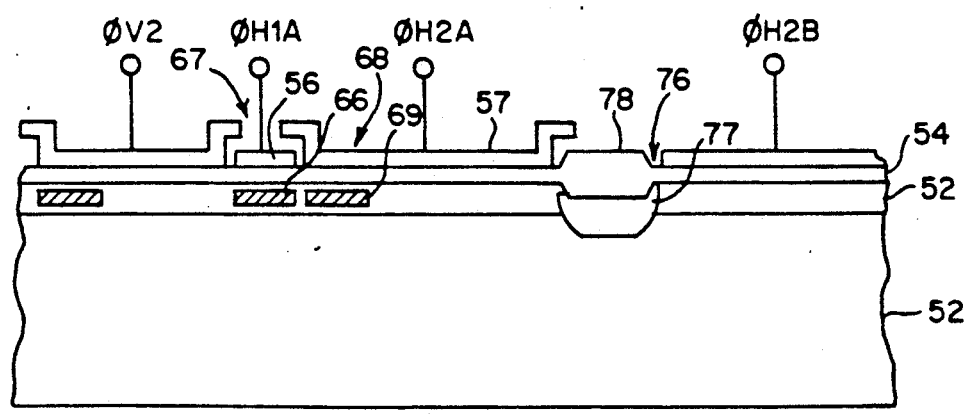
FIG. 5 is a cross section taken along the line 5—5 in FIG. 2.

Charge carriers are transferred from vertical registers 15 in imaging region 12 to register 20 through transfer gates 65 (FIG. 4) and transfer gates 67 and 68 (FIG. 5). Gates 65 and gates 67 and 68 are of a type similar to transfer gate 62. With reference to FIG. 4, a barrier implant 66 and electrode 56 in gate 65 function in the same manner as implant 60 and electrode 58 in gate 62. With reference to FIG. 5, barrier implants 66 and 69 function with electrodes 56 and 57, respectively, in the same manner as the implant 60 and electrode 58. As a result of the structure of transfer gates 65, 67, and 68, separate gate electrodes for these transfer gates are not needed.

The structure which makes it possible to implement the dual horizontal register scheme in the true two-phase device of the present invention is shown in FIG. 5. Without the extension of electrode 56 between the electrode for $\phi V2$ and electrode 57 for $\phi H2A$, the last vertical shift register clock phase, $\phi V2$, would be electrically shorted to $\phi H2A$ since they are formed by the same level of gate electrode material. Also, implant 66 is required under electrode 56 to avoid creating a potential well or pocket under the electrode 56 which would result in poor transfer efficiency from register 15 to register 20. Another essential element of the structure shown in FIG. 5 is the implant 69 which prevents "back spill" into register 15 during horizontal readout of the registers 20 and 22. Thus, for example, when $\phi H1A$ (electrode 56) is high and $\phi H2A$ (electrode 57) is low, "back spill" would occur if the implant 69 was not there.

An important feature in the disclosed means for transferring charge carriers from register 20 to register 22 is shown in FIG. 2. As shown in this figure, a transfer region 70 between registers 20 and 22 is made wider than an adjacent storage region 72 in register 20. If the width of the transfer region 70 were made less than, or equal to, the width of storage region 72, a potential barrier would exist between storage region 72 and transfer region 70. Such a potential barrier is caused by three factors. Two of the factors have to do with the definition of the channel stops (not shown). During growth of the local field isolation for the channel stops, the "bird's beak" and boron encroach into the active channel region, thereby effectively reducing its width. These factors combine with the third factor, the electrostatic effect, to form the potential barrier. As a result of making the region 70 wider, the potential barrier is eliminated, and an efficient transfer of charge carriers can be accomplished.

In the present invention, transfer regions 70 are formed adjacent every other storage region 72. In FIG. 5, there is shown a cross section, taken along the line 5—5 in FIG. 2. It will be seen that a channel stop 76 between the registers 20 and 22 is formed by a p+ region 77 and a thick insulating layer 78. A channel stop 76 is disposed between each of the transfer regions 70.

Figure 6:
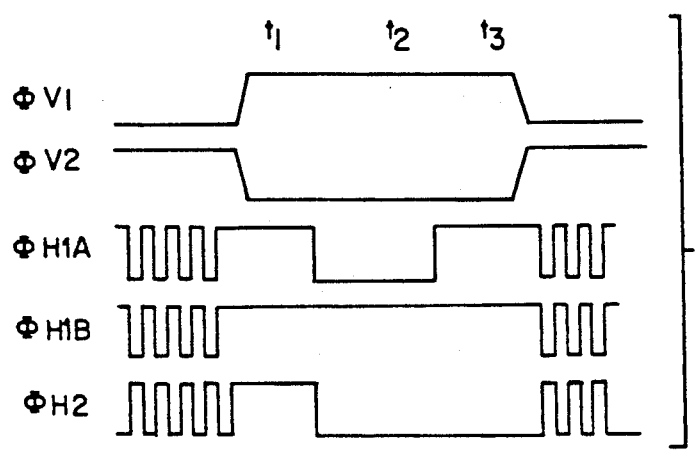
FIG. 6 is a timing diagram showing the sequence of signals provided to the image sensor to transfer charge carriers into the horizontal shift registers and between the registers.
Figure 7:
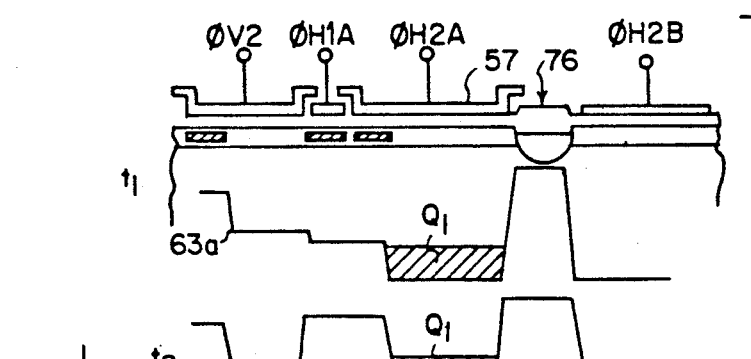
FIGS. 7 and 8 are schematic diagrams showing the transfer of charge carriers between the imaging region and the horizontal shift registers and between the shift registers during one cycle.

The transfer of charge carriers to registers 20 and 22 and between the two registers can be illustrated with reference to FIGS. 6-8. In FIG. 6, there is shown a timing diagram of the signals provided to sensor 10 for the transfer of charge carriers from imaging region 12 to register 20 and from register 20 to register 22. In FIGS. 7 and 8, the transfer of the charge carriers is illustrated for times $t_1-t_3$. Potential profiles $63a-63c$ are produced along the cross section shown in FIG. 5 during times $t_1-t_3$, and potential profiles $64a-64c$ are produced along the cross section shown in FIG. 4 during times $t_1-t_3$.

In FIG. 6, $\phi V1$ and $\phi V2$ represent clock signals to the vertical CCD registers 15 in the imaging region 12, and $\phi H1A$, $\phi H1B$, and $\phi H2$ represent clock signals to the registers 20 and 22. At time $t_1$, $\phi V2$ is low, and $\phi V1$, $\phi H1A$, $\phi H1B$, and $\phi H2$ are high. At time $t_1$, a charge carrier packet $Q_1$ is moved under a gate electrode 57 in horizontal shift register 20, and a charge packet $Q_2$ is moved under gate electrode 56 in register 20. At time $t_2$, $\phi H1A$ and $\phi H2$ go low, and charge carrier packet $Q_2$ is moved under electrode 58 in register 22; $Q_1$ is confined under electrode 57 due to channel stop 76. At time $t_3$, $\phi H1A$ goes high and charge carrier packet $Q_1$ is moved under electrode 56 in register 20. After time $t_3$, $\phi H1A$, $\phi H1B$, $\phi H2$ are cycled as shown to move the charge carrier packets $Q_1$ and $Q_2$ out of the registers 20 and 22. It is important to note that $\phi H1A$ and $\phi H1B$ are clocked in unison during this time and that the potential barrier created by implant 60 maintains the separation of charge packets $Q_1$ and $Q_2$ between the registers 20 and 22.

The arrangement of horizontal registers disclosed herein can be used for parallel readout of one complete line of signal charge at data rates in excess of 30 frames per second. As a result of eliminating the separate transfer gate between the horizontal registers in image sensor 10, only three clocks are required to operate both registers. It will be apparent to those skilled in the art that the principles of the present invention could be used in a device having more than two horizontal registers.

The invention has been described in detail with particular reference to the preferred embodiments thereof, but it will be understood that variations and modifications can be effected within the spirit and scope of the invention.

I claim:

1. An image sensor comprising:
   an imaging region which includes a substrate of semiconductor material, said region including means in said material for accumulating charge carriers and for transferring said charge carriers from said region;
   at least two shift registers arranged in a side-by-side relationship adjacent said region, one of said shift registers including a series of storage regions for receiving said charge carriers from said region;
   means for controlling the transfer of charge carriers from said one shift register to another shift register, said controlling means including transfer regions adjacent certain of said storage regions and means adjacent the remainder of said storage regions for blocking the transfer of charge carriers from said one shift register to the other shift register, each of said transfer regions including a barrier implant therein;
   means for effecting the transfer of charge carriers from said one shift register to the other shift register; and
   means for clocking said shift registers to transfer said charge carriers from said registers to an output circuit.

2. An image sensor, as defined in claim 1, wherein a transfer region is disposed adjacent every other storage region in said one register.

3. An image sensor, as defined in claim 1, wherein said registers are CCD shift registers.

4. An image sensor, as defined in claim 1, wherein said transfer regions are wider than said storage regions.

5. An image sensor, as defined in claim 1, wherein said shift registers are clocked in unison to transfer said charge carriers from said registers to said output circuit.

6. An image sensor, as defined in claim 1, wherein said means for accumulating and transferring charge carriers includes a matrix of photoelectric conversion elements.

7. An image sensor, as defined in claim 6, wherein said means for accumulating and transferring charge carriers includes columns of CCD shift registers which receive charge carriers from said elements.

8. An image sensor, as defined in claim 1, wherein said barrier implant is formed in a n-type buried channel, and said implant is a p-type material.

9. An image sensor, as defined in claim 1, wherein said effecting means includes an electrode in said other register.

10. An image sensor, as defined in claim 1, wherein an electrode in said other register extends over said barrier implant.

11. An image sensor comprising:
    an imaging region which includes a substrate of semiconductor material, said region including means in said material for accumulating charge carriers and for transferring said charge carriers from said region;
    at least two CCD shift registers arranged in a side-by-side relationship adjacent said region, a first shift register having a series of storage regions for receiving said charge carriers from said region and a second shift register which is adapted to receive said charge carriers from every other storage region in said first shift register;
    means for controlling the transfer of said charge carriers from said first shift register to the second shift register, said controlling means comprising a transfer region in said semiconductor material adjacent every other storage region of said first shift register and means in said semiconductor material adjacent the remainder of said storage regions for blocking the transfer of said charge carriers from said first shift register to said second shift register, each of said transfer regions having a barrier implant therein;
    means for effecting the transfer of charge carriers from said first shift register to the second shift register; and
    means for clocking said shift registers in unison to transfer said charge carriers from said registers to an output circuit.

12. An image sensor, as defined in claim 11, wherein each of said transfer regions is wider than an adjacent storage region.

13. An image sensor comprising:
    an imaging region which includes a substrate of semiconductor material, said region including means in said material for accumulating charge carriers and vertical CCD's for transferring said charge carriers from said region;
    a first horizontal CCD arranged adjacent said imaging region having a series of storage regions for receiving said charge carriers from said vertical CCD's; and means for controlling the transfer of said charge carriers from said vertical CCD's to said horizontal CCD, said controlling means including single transfer gates adjacent some of said vertical CCD's and a pair of transfer gates adjacent each of the remainder of said vertical CCD's.

14. An image sensor, as defined in claim 13, wherein said horizontal CCD includes a first set of electrodes which are operable in said single transfer gates and in one of said transfer gates in each of said pair of transfer gates, and a second set of electrodes which are operable in the other transfer gate in each of said pair of transfer gates.

15. An image sensor, as defined in claim 14, wherein each of said transfer gates has a barrier implant associated therewith.

16. An image sensor, as defined in claim 15, wherein a second horizontal CCD is arranged adjacent said horizontal CCD.

* * * * *